US010272685B2

(12) United States Patent
Fukuzawa et al.

(10) Patent No.: US 10,272,685 B2
(45) Date of Patent: Apr. 30, 2019

(54) METHOD OF MANUFACTURING PIEZOELECTRIC DEVICE

(71) Applicant: SEIKO EPSON CORPORATION, Tokyo (JP)

(72) Inventors: Yuma Fukuzawa, Matsumoto (JP); Shunya Fukuda, Azumino (JP); Masato Shimada, Chino (JP); Mutsuhiko Ota, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/418,882

(22) Filed: Jan. 30, 2017

(65) Prior Publication Data

US 2017/0217182 A1 Aug. 3, 2017

(30) Foreign Application Priority Data

Feb. 2, 2016 (JP) .................................. 2016-018322

(51) Int. Cl.
*B05D 5/12* (2006.01)
*B41J 2/16* (2006.01)
*H01L 41/297* (2013.01)
*H01L 41/09* (2006.01)
*H01L 41/257* (2013.01)

(52) U.S. Cl.
CPC ............ *B41J 2/1607* (2013.01); *B41J 2/164* (2013.01); *H01L 41/0973* (2013.01); *H01L 41/257* (2013.01); *H01L 41/297* (2013.01)

(58) Field of Classification Search
None
See application file for complete search history.

(56) References Cited

U.S. PATENT DOCUMENTS

| 4,714,848 A | 12/1987 | Chen |
| 2004/0187281 A1 | 9/2004 | Hsu et al. |

(Continued)

FOREIGN PATENT DOCUMENTS

| JP | 04206976 A | 7/1992 |
| JP | 2006-174618 | 6/2006 |

(Continued)

OTHER PUBLICATIONS

European Search Report for Application No. 17154121.2 dated Jun. 27, 2017.

(Continued)

*Primary Examiner* — Austin Murata
(74) *Attorney, Agent, or Firm* — Workman Nydegger

(57) ABSTRACT

A method is provided for manufacturing a piezoelectric device including a piezoelectric element that is disposed above a diaphragm and that has a multilayer structure including a first electrode disposed above the diaphragm, a piezoelectric layer disposed on the first electrode, and a second electrode disposed on the piezoelectric layer. The method includes forming the multilayer structure including the first electrode, the piezoelectric layer, and the second electrode above the diaphragm, forming a voltage application electrode extending outwardly from an end of the second electrode to cover a region located above the piezoelectric layer in an inactive section having no second electrode, applying a voltage between the first electrode and the second electrode, and removing the voltage application electrode.

5 Claims, 11 Drawing Sheets

(56) References Cited

U.S. PATENT DOCUMENTS

| | | | | |
|---|---|---|---|---|
| 2008/0083278 A1* | 4/2008 | Takahashi | ........... | G01C 19/5663 |
| | | | | 73/504.15 |
| 2013/0210175 A1* | 8/2013 | Hoisington | .......... | B41J 2/14233 |
| | | | | 438/21 |
| 2015/0070443 A1* | 3/2015 | Iwashita | .............. | B41J 2/14233 |
| | | | | 347/68 |
| 2017/0205234 A1 | 4/2017 | Honda | | |

FOREIGN PATENT DOCUMENTS

| | | | |
|---|---|---|---|
| JP | 2012-196905 | * | 10/2012 |
| JP | 2012 196905 A | | 10/2012 |
| WO | 2015198513 A1 | | 12/2015 |

OTHER PUBLICATIONS

European Search Report issued in Application No. 17154121 dated Oct. 26, 2017.

* cited by examiner

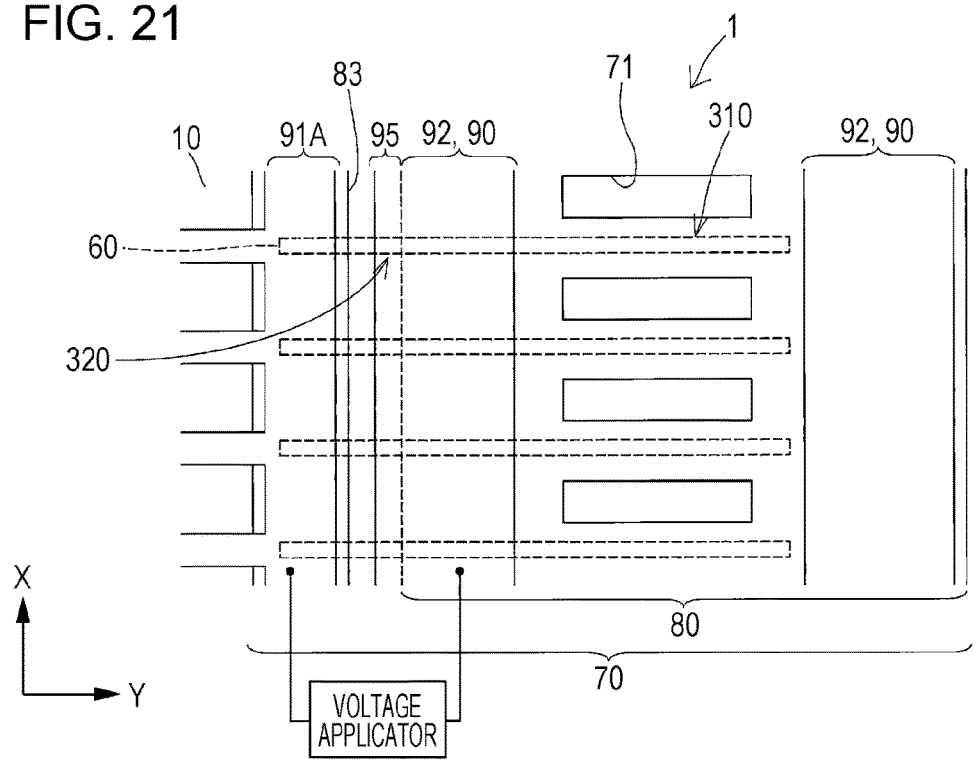
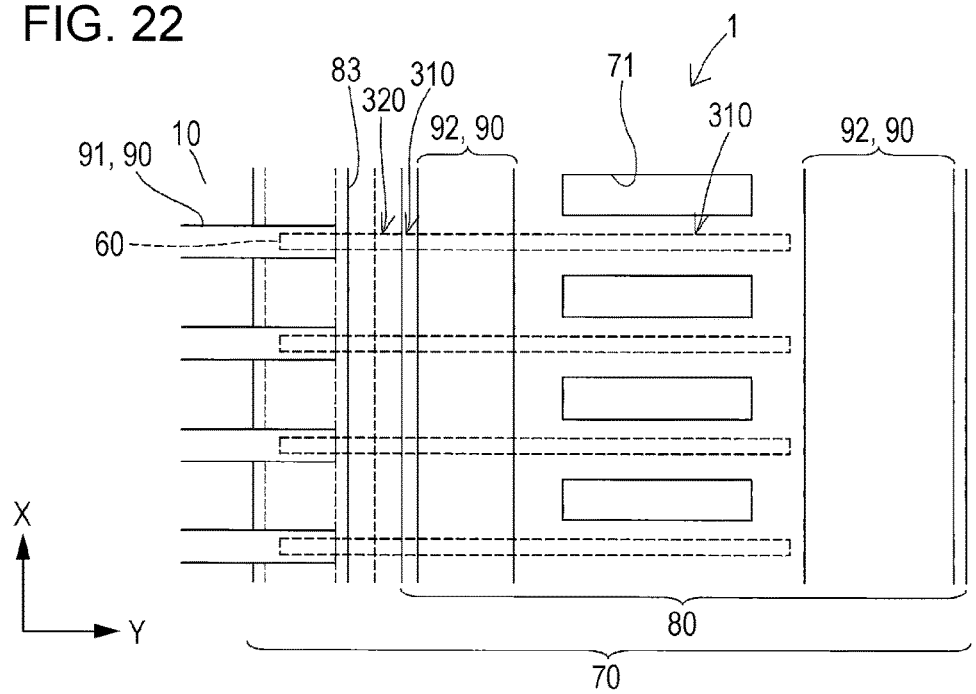

METHOD OF MANUFACTURING PIEZOELECTRIC DEVICE

BACKGROUND

1. Technical Field

The present invention relates to a method of manufacturing a piezoelectric device having a piezoelectric element including a first electrode, a piezoelectric layer, and a second electrode that are disposed on a diaphragm on a substrate.

2. Related Art

An ink jet recording head for ejecting an ink droplet is a typical example of a liquid ejecting head for ejecting a liquid droplet. For example, such an ink jet recording head includes a flow channel substrate that defines a pressure generating chamber in communication with a nozzle opening, and a piezoelectric actuator provided on one side of the flow channel substrate. The piezoelectric actuator is a piezoelectric element and changes the pressure of ink in the pressure generating chamber so that an ink droplet can be ejected from the nozzle opening.

The piezoelectric actuator includes individual electrodes separately provided for different active sections and a common electrode shared with the active sections. A piezoelectric layer is interposed between the individual electrode and the common electrode in the active section and not interposed between the individual electrode and the common electrode in an inactive section. In general, the active section is subjected to polarization treatment and polarized in one direction. In contrast, the inactive section is not polarized in one direction. JP-A-2006-174618, for example, describes a piezoelectric actuator where an active section and an inactive section are polarized in opposite directions.

As described above, in piezoelectric actuators in the related art, although an active section is polarized in one direction, an inactive section is unpolarized or polarized in a direction opposite to the polarization direction of the active section. Accordingly, a concentration of internal stress is caused at a boundary between the active section and the inactive section. The stress concentration may cause burning and cracking in the piezoelectric actuator, thus damaging the piezoelectric actuator.

Such problems are not unique to piezoelectric devices used for liquid ejecting heads, including ink jet recording heads, and may also be encountered with piezoelectric devices for other applications.

SUMMARY

An advantage of some aspects of the invention is to provide a method of manufacturing a piezoelectric device having improved reliability.

An aspect of the invention provides a method of manufacturing a piezoelectric device including a piezoelectric element that is disposed above a substrate and that has a multilayer structure including a first electrode disposed above the substrate, a piezoelectric layer disposed on the first electrode, and a second electrode disposed on the piezoelectric layer. The method includes forming the multilayer structure including the first electrode, the piezoelectric layer, and the second electrode above the substrate, forming a voltage application electrode extending outwardly from an end of the second electrode to cover a region located above the piezoelectric layer and having no second electrode, applying a voltage between the first electrode and the second electrode, and removing the voltage application electrode.

According to the aspect, damage caused by burning and cracking at a boundary, defined by the end of the second electrode, between an active section and an inactive section is prevented or reduced, thus improving reliability of the piezoelectric element of the piezoelectric device.

Preferably, the piezoelectric device further includes a second lead electrode connected to the second electrode, and part of the second lead electrode is formed as the voltage application electrode in the region. This removes the need to form the voltage application electrode from a material different from that of the second lead electrode, thus reducing manufacturing cost and steps.

It is preferable that a second electrode layer for the second electrode is formed above the piezoelectric layer, and the second electrode layer is patterned into the second electrode and the voltage application electrode extending from the second electrode. This removes the need to form the voltage application electrode from a material different from that of the second lead electrode, thus reducing manufacturing cost and steps.

It is preferable that multiple active sections interposed between the first electrode and the second electrode are formed, one of the first electrode and the second electrode is formed as individual electrodes that are electrically independent of one another and separately provided for different active sections, the other of the first electrode and the second electrode is formed as a common electrode shared with the active sections, a wiring portion connected in common to the individual electrodes is formed, a voltage is applied between the common electrode and the wiring portion, and the wiring portion is removed. This allows the voltage to be applied through the wiring portion to each of the individual electrodes, thus simplifying the manufacturing process of the piezoelectric device.

It is preferable that the first electrode is formed as the individual electrodes that are electrically independent of one another and separately provided for different active sections, the second electrode is formed as the common electrode shared with the active sections, and the wiring portion is partially removed to form multiple first lead electrodes that are separately connected to different individual electrodes. This allows the voltage to be applied through the wiring portion to each of the first electrodes as the individual electrodes, thus simplifying the manufacturing process of the piezoelectric device.

BRIEF DESCRIPTION OF THE DRAWINGS

The invention will be described with reference to the accompanying drawings, wherein like numbers reference like elements.

FIG. 21 is a plan view illustrating a flow channel substrate of a recording head according to Embodiment 2.

FIG. 22 is a plan view illustrating the flow channel substrate of the recording head according to Embodiment 2.

DESCRIPTION OF EXEMPLARY EMBODIMENTS

Embodiment 1

Figure 1:
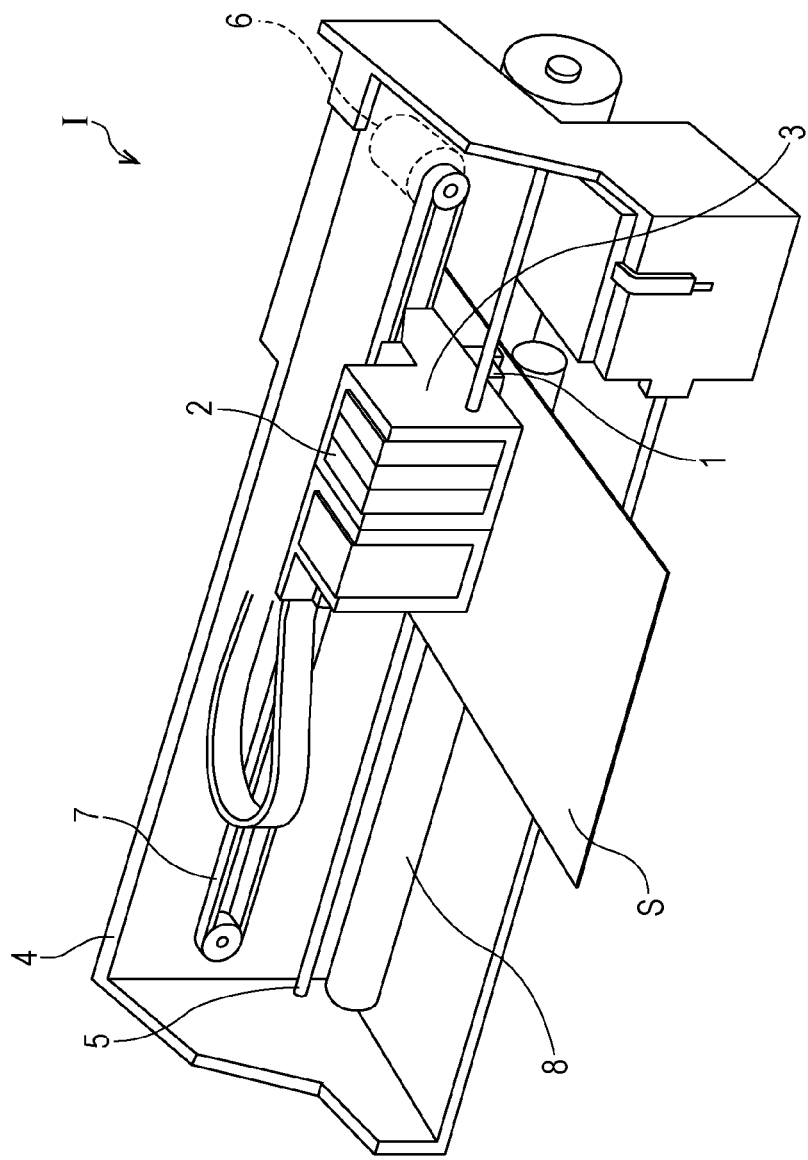
FIG. 1 is a schematic perspective view of an example of an ink jet recording apparatus.

FIG. 1 illustrates a schematic configuration of an ink jet recording apparatus I as an example of a liquid ejecting apparatus according to the present embodiment.

The ink jet recording apparatus I includes a recording head 1 mounted on a carriage 3. A cartridge 2 as an ink supplier is detachably attached to the recording head 1. The carriage 3 is provided on a carriage shaft 5, which is attached to an apparatus body 4, and is movable in the axial direction of the carriage shaft 5.

The carriage 3 with the recording head 1 moves along the carriage shaft 5 when a driving force of a drive motor 6 is transmitted to the carriage 3 through a timing belt 7 and multiple gears, which are not shown in the drawings. The apparatus body 4 is provided with a transport roller 8 as a transporter for transporting a recording sheet S that is a recording medium such as a paper sheet. The transporter for transporting the recording sheet S is not limited to a transport roller. Alternatively, for example, the transporter can be a belt or a drum.

Although the ink jet recording apparatus I is configured in the present embodiment such that the recording head 1 is mounted on the carriage 3 and moves in the main scanning direction, it is not limited to this configuration. Alternatively, for example, the ink jet recording apparatus I can use what is called a line configuration in which the recording head 1 is fixed and printing is achieved by moving the recording sheet S, such as a paper sheet, in the sub scanning direction.

Although the ink jet recording apparatus I is configured such that the cartridge 2 serving as a liquid reservoir is mounted on the carriage 3, it is not limited to this configuration. Alternatively, for example, the liquid reservoir such as an ink tank can be fixed to the apparatus body 4 and connected to the recording head 1 through a supply pipe such as a tube. Alternatively, the liquid reservoir can be eliminated from the ink jet recording apparatus I.

Figure 2:
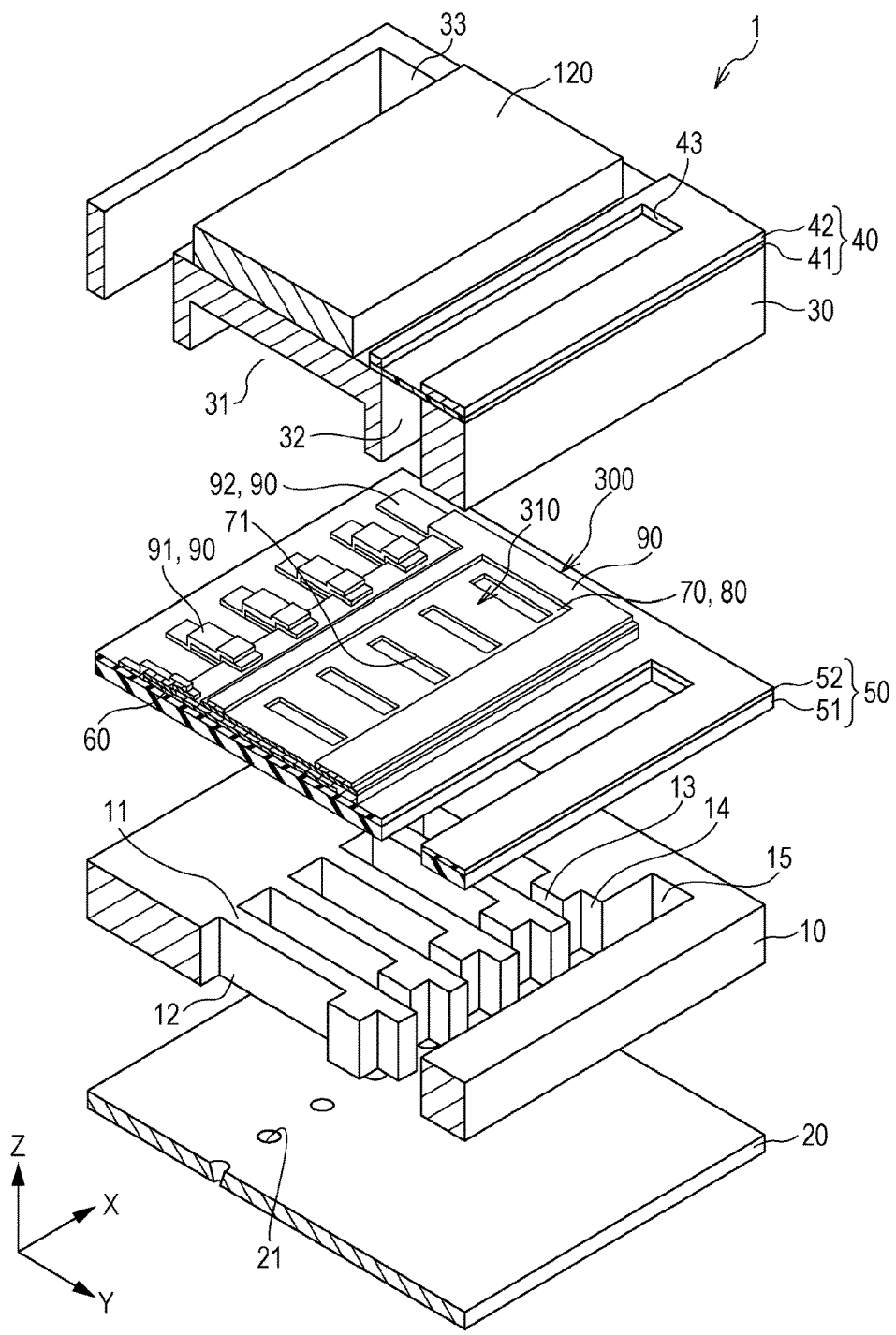
FIG. 2 is an exploded perspective view of a recording head according to Embodiment 1.
Figure 3:
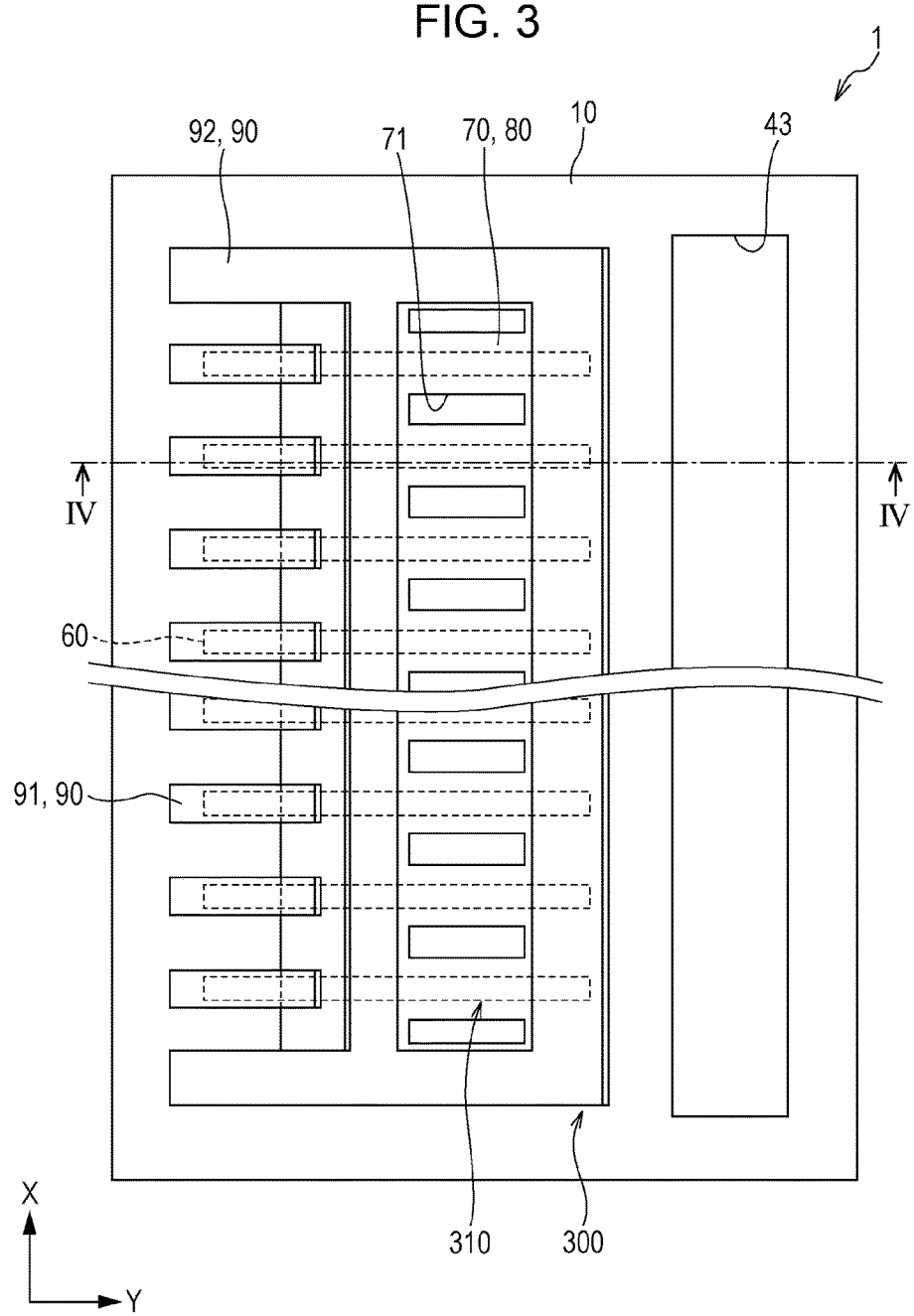
FIG. 3 is a plan view illustrating the recording head according to Embodiment 1.
Figure 4:
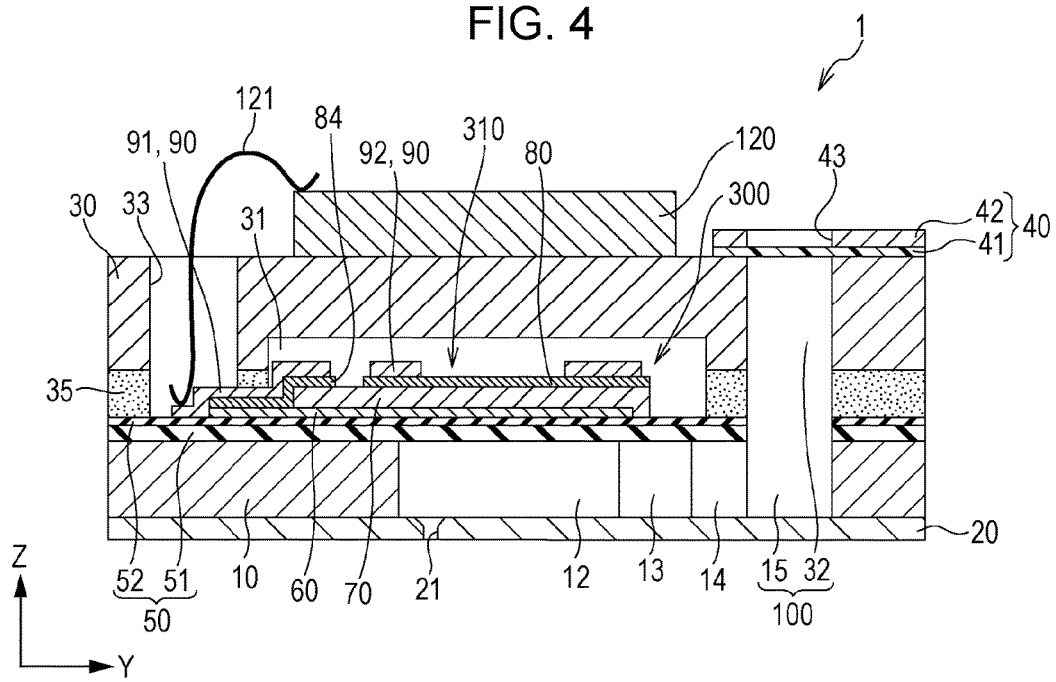
FIG. 4 is a cross-sectional view taken along line IV-IV in FIG. 3.

The ink jet recording head 1 (hereinafter also referred to simply as the recording head 1) is described below with reference to FIGS. 2 to 4. FIG. 2 is an exploded perspective view of the ink jet recording head 1 according to the present embodiment, and FIG. 3 is a plan view of FIG. 2. FIG. 4 is a cross-sectional view taken along line IV-IV in FIG. 3.

A flow channel substrate 10 has pressure generating chambers 12 that are defined by partition walls 11 and aligned in a direction in which nozzle openings 21 for ejecting the same color of ink are aligned. This direction is hereinafter referred to as the alignment direction of the pressure generating chambers 12 or a first direction X. A direction perpendicular to the first direction X is hereinafter referred to as a second direction Y. A direction perpendicular to both the first direction X and the second direction Y is hereinafter referred to as a third direction Z. Coordinate axes illustrated in the drawings represent the first direction X, the second direction Y, and the third direction Z. The direction of an arrow may be referred to as a positive (+) direction, and the direction opposite to the direction of an arrow may be referred to as a negative (−) direction. The directions X, Y, and Z have a perpendicular relationship to each other in the present embodiment. Alternatively, the components can be arranged to have a relationship different from a perpendicular relationship.

The flow channel substrate 10 also has ink supply channels 13 and communication channels 14 that are defined by the partition walls 11 and located next to one end of the pressure generating chambers 12 in the second direction Y. One of the opposing partition walls 11 projects in the first direction X so that the ink supply channel 13 has an opening area smaller than that of the pressure generating chamber 12. The communication channel 14 has almost the same width as the pressure generating chamber 12 in the first direction X. The flow channel substrate 10 further has a communication chamber 15 outside the communication channels 14. Specifically, the communication chamber 15 is on the opposite side of the communication channels 14 from the pressure generating chambers 12 in the second direction Y. The communication chamber 15 is a portion of a manifold 100, which serves as a common ink chamber for all the pressure generating chambers 12. In summary, the flow channel substrate 10 has a liquid flow channel including the pressure generating chambers 12, the ink supply channels 13, and the communication chamber 15.

The liquid flow channel including the pressure generating chamber 12 is exposed to a first side of the flow channel substrate 10. A nozzle plate 20 is joined to the first side of the flow channel substrate 10, for example, by using an adhesive or a thermal bonding film. The nozzle openings 21 are drilled into the nozzle plate 20 and in communication with the pressure generating chambers 12. As such, the nozzle openings 21 in the nozzle plate 20 are aligned in the first direction X.

For example, the nozzle plate 20 can be made of a metal such as steel special use stainless (SUS), an organic material such as polyimide resin, or a monocrystalline silicon substrate. An advantage of using a monocrystalline silicon substrate as the nozzle plate 20 is that the nozzle plate 20 and the flow channel substrate 10 have almost the same thermal expansion coefficient. Accordingly, problems such as warping, peeling, and cracking are less likely to occur under heating or cooling conditions.

A diaphragm 50 (vibration plate) as an example of a substrate is provided on a second side (i.e., on the +Z direction side) of the flow channel substrate 10, opposite to the first side where the nozzle plate 20 is provided. According to the present embodiment, the diaphragm 50 includes an elastic film 51 on the flow channel substrate 10 and an insulation film 52 on the elastic film 51. The elastic film 51 is made of silicon oxide, and the insulation film 52 is made of zirconium oxide. The liquid flow channel including the pressure generating chambers 12 is formed by anisotropically etching the flow channel substrate 10 from the first side. The liquid flow channel including the pressure generating chambers 12 is defined by the elastic film 51 on the second side of the flow channel substrate 10. The diaphragm 50 is not limited to the structure described above. Alternatively, for example, the diaphragm 50 can eliminate one of the elastic film 51 and the insulation film 52, and can also include an additional layer.

A piezoelectric element 300 for changing the pressure of ink in the pressure generating chambers 12 is provided on the diaphragm 50. The piezoelectric element 300 has a multilayer structure including a first electrode 60 provided on the diaphragm 50, a piezoelectric layer 70 on the first electrode 60, and a second electrode 80 on the piezoelectric layer 70. Each of the first electrode 60 and the second electrode 80 is electrically conductive. The piezoelectric element 300 is displaced when a voltage is applied between the first electrode 60 and the second electrode 80. Specifically, the application of a voltage between the first electrode 60 and the second electrode 80 causes piezoelectric strain in a section of the piezoelectric layer 70 interposed between the first electrode 60 and the second electrode 80. The section of the piezoelectric layer 70 where the piezoelectric strain is caused is hereinafter referred to as an active section 310.

The first electrode 60 is divided for each pressure generating chamber 12 and forms individual electrodes that are independent of one another and provided separately for different active sections 310, which serve as practical drivers of the piezoelectric element 300. The width of the first electrode 60 is smaller than the width of the pressure generating chamber 12 in the first direction X. The first electrode 60 extends beyond the pressure generating chamber 12 in the second direction Y so that each end of the first electrode 60 is located outside the pressure generating chamber 12. A lead electrode 90 made of, for example, gold (Au) is connected through a conductive layer 84 to a first end of the first electrode 60 on the opposite side (i.e., on the −Y direction side) to the communication channel 14 in the second direction Y. The first electrode 60 can be made of any metal. For example, platinum (Pt) or iridium (Ir) is a preferable material for the first electrode 60.

The piezoelectric layer 70 extends continuously in the first direction X. The width of the piezoelectric layer 70 in the second direction Y is larger than the length of the pressure generating chamber 12 in the second direction Y, and the piezoelectric layer 70 extends to the outside of the pressure generating chamber 12. A first end of the piezoelectric layer 70 on the near side to the ink supply channel 13 (i.e., on the +Y direction side) is located beyond a second end of the first electrode 60 in the second direction Y, and the second end of the first electrode 60 is covered with the piezoelectric layer 70. In contrast, a second end of the piezoelectric layer 70 on the near side to the nozzle opening 21 (i.e., on the −Y direction side) is located within the first end of the first electrode 60, and the first end of the first electrode 60 is not covered with the piezoelectric layer 70.

The piezoelectric layer 70 is formed by forming an oxide of a piezoelectric material having a polarization structure on the first electrode 60. For example, such a piezoelectric material can be a perovskite oxide having a general formula of $ABO_3$. For example, the piezoelectric material used for the piezoelectric layer 70 can be a lead-based piezoelectric material or a lead-free piezoelectric material.

The piezoelectric layer 70 has a depression 71 at a position corresponding to each partition wall 11 between adjacent pressure generating chambers 12. The depression 71 of the piezoelectric layer 70 allows the piezoelectric element 300 to be suitably displaced.

The second electrode 80 is provided on the opposite side (i.e., on the +Z direction side) of the piezoelectric layer 70 with respect to the first electrode 60 and formed as a common electrode shared with the active sections 310. According to the present embodiment, the second electrode 80 is provided inside the depression 71 as well as outside the depression 71. Alternatively, the second electrode 80 may be provided only outside the depression 71.

As described above, in the piezoelectric element 300, the first electrode 60 is formed as individual electrodes that are independent of one another and provided separately for different active sections 310, while the second electrode 80 is formed as a common electrode provided continuously for all the active sections 310. Alternatively, the first electrode 60 can be formed as a common electrode provided continuously for all the active sections 310, while the second electrode 80 can be formed as individual electrodes that are independent of one another and provided separately for different active sections 310. Alternatively, the first electrode 60 alone can be formed to serve as a diaphragm. This approach can eliminate the need for the elastic film 51 and the insulation film 52. Alternatively, the piezoelectric element 300 itself can be formed to practically serve as a diaphragm.

The flow channel substrate 10 is provided with first lead electrodes 91 and a second lead electrode 92. These lead electrodes 91 and 92 are hereinafter sometimes collectively referred to as the lead electrode 90.

The first lead electrodes 91 are separately connected to the first electrodes 60 as individual electrodes of the piezoelectric element 300. The second lead electrode 92 is connected to the second electrode 80 as a common electrode of the piezoelectric element 300. According to the present embodiment, the first lead electrode 91 and the second lead electrode 92 are exposed to a through hole 33 in a protection substrate 30, which is described later. The first lead electrode 91 is connected to the first electrode 60 through the conductive layer 84, which is the same layer as the layer of the second electrode 80. Alternatively, the first lead electrode 91 can be connected directly to the first electrode 60.

The protection substrate 30 is joined to the flow channel substrate 10 by an adhesive 35. The protection substrate 30 has a manifold portion 32. The manifold portion 32 extends through the protection substrate 30 in the thickness direction of the protection substrate 30 across the width of the pressure generating chambers 12. Thus, the manifold portion 32 is in communication with the communication chamber 15 of the flow channel substrate 10 to form the manifold 100, which serves as the common ink chamber for all the pressure generating chambers 12, as described above.

The protection substrate 30 has a piezoelectric element holder 31 that is positioned to face the piezoelectric element 300 and defines a space for allowing movement of the piezoelectric element 300. The space of the piezoelectric element holder 31 can have any size that allows movement of the piezoelectric element 300 and can also be hermetically sealed or not hermetically sealed. The protection substrate 30 can be made of a material, such as a glass or ceramic, having substantially the same thermal expansion rate as the flow channel substrate 10. As an example, according to the present embodiment, the protection substrate 30 is made of a monocrystalline silicon substrate, which is the same material as used for the flow channel substrate 10.

The through hole 33 in the protection substrate 30 extends through the protection substrate 30 in the thickness direction of the protection substrate 30. A portion near the end of the lead electrode 90 extended from the piezoelectric element 300 is located inside the through hole 33. A drive circuit 120 for driving the aligned piezoelectric elements 300 is fixed to the protection substrate 30. For example, a circuit board or a semiconductor integrated circuit (IC) can be used for the drive circuit 120. The drive circuit 120 and the lead electrode 90 are electrically connected through a connecting wire 121 that is an electrically conductive wire such as a bonding wire.

A compliance substrate 40 including a sealing film 41 and a fixing plate 42 is joined to the protection substrate 30. The sealing film 41 is made of a flexible material having low stiffness and seals one side of the manifold portion 32. The fixing plate 42 is made of a fairly rigid material. The fixing plate 42 has an opening 43 that is formed as a through hole extending in the thickness direction of the fixing plate 42 and positioned to face the manifold 100. As such, one side of the manifold 100 is sealed with only the flexible sealing film 41.

When the recording head 1 ejects an ink droplet, ink is taken from the liquid reservoir, which stores the ink, and fills the flow channel from the manifold 100 to the nozzle opening 21. Next, a voltage is applied to the piezoelectric element 300 corresponding to the pressure generating chamber 12 in accordance with a signal from the drive circuit 120 so that the diaphragm 50 can be deformed together with the piezoelectric element 300 by warping. The deformation increases the pressure in the pressure generating chamber 12, and accordingly the ink droplet is ejected from a corresponding nozzle opening 21.

Figure 5:
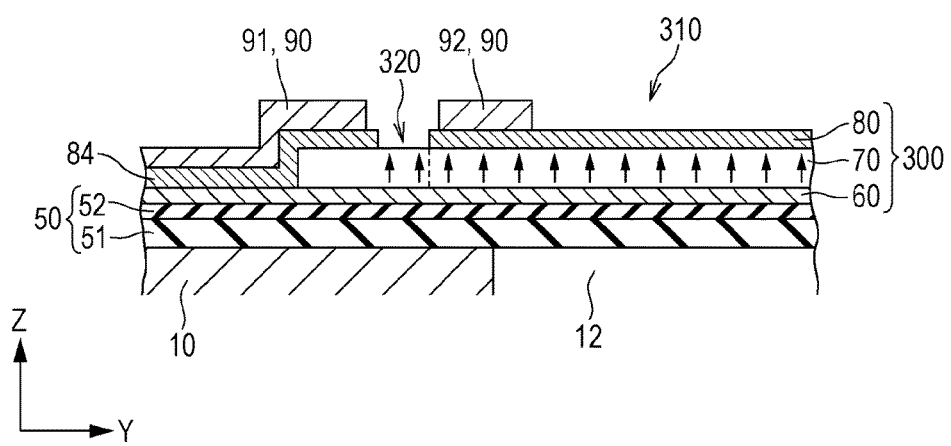
FIG. 5 is an enlarged cross-sectional view illustrating main components in FIG. 4.

The piezoelectric element 300 is described in detail with reference to FIG. 5. FIG. 5 is an enlarged cross-sectional view illustrating main components in FIG. 4. For the sake of clarity, in FIG. 5, a cross-section of the piezoelectric layer 70 is illustrated without hatching.

The piezoelectric layer 70 of the piezoelectric element 300 has the active section 310 and an inactive section 320. The active section 310 is the section where the piezoelectric layer 70 is interposed between the first electrode 60 and the second electrode 80. The inactive section 320 is the section where the piezoelectric layer 70 is not interposed between the first electrode 60 and the second electrode 80. According to the present embodiment, the inactive section 320 is exposed without being covered with the second electrode 80.

The active section 310 is polarized by an applied voltage and remains polarized after removal of the voltage. As indicated by arrows in FIG. 5, the active section 310 is equally polarized in the +Z direction. Likewise, the inactive section 320 is polarized by the voltage and remains polarized after removal of the voltage. The inactive section 320 is equally polarized in the +Z direction and has the same polarization direction as the active section 310.

The inactive section 320 can be either partially or fully polarized as long as a part of the inactive section 320 that extends from a boundary with the active section 310 is polarized in the same direction as the active section 310.

Since the inactive section 320 is polarized in the same direction as the active section 310, stress concentration is reduced at the boundary between the active section 310 and the inactive section 320. As such, damage caused by burning and cracking at the boundary is prevented or reduced in the piezoelectric element 300 and thus the piezoelectric element 300 has improved reliability.

A method of manufacturing a recording head according to the present embodiment is described with reference to FIGS. 6 to 20. FIGS. 6 to 20 are cross-sectional views illustrating the method of manufacturing the recording head.

Figure 6:
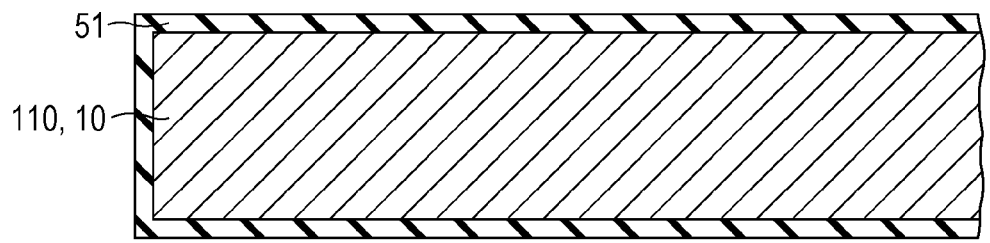
FIG. 6 is a cross-sectional view illustrating a method of manufacturing the recording head according to Embodiment 1.

As illustrated in FIG. 6, an elastic film 51 is formed on a surface of a flow channel wafer 110. The flow channel wafer 110 is a silicon wafer and provides the flow channel substrate 10. According to the present embodiment, the elastic film 51 is a silicon dioxide film formed by thermally oxidizing the flow channel wafer 110. The elastic film 51 is not limited to a silicon dioxide film. Alternatively, for example, the elastic film 51 can be a silicon nitride film, a polysilicon film, or an organic film such as a polyimide film or a parylene film. A method of forming the elastic film 51 is not limited to thermal oxidation. Alternatively, for example, the elastic film 51 can be formed by sputtering, chemical vapor deposition (CVD), or spin coating.

Figure 7:
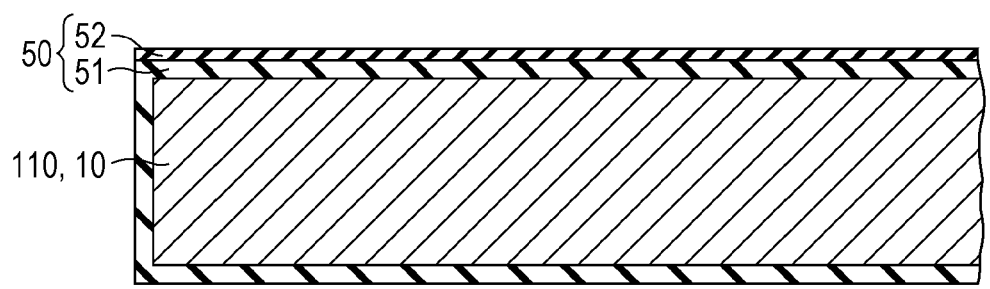
FIG. 7 is a cross-sectional view illustrating the method of manufacturing the recording head according to Embodiment 1.

Next, as illustrated in FIG. 7, an insulation film 52 made of zirconium oxide is formed on the elastic film 51. A material for the insulation film 52 is not limited to zirconium oxide, but includes titanium oxide ($TiO_2$), aluminum oxide ($Al_2O_3$), hafnium oxide ($HfO_2$), magnesium oxide (MgO), and lanthanum aluminate ($LaAlO_3$). For example, the insulation film 52 can be formed by sputtering, chemical vapor deposition (CVD), or vacuum deposition. According to the present embodiment, the elastic film 51 and the insulation film 52 form the diaphragm 50. Alternatively, the diaphragm 50 can be formed by only one of the elastic film 51 and the insulation film 52. An additional layer for improving adhesion to a base of the first electrode 60 can be provided on the diaphragm 50 as necessary.

Figure 8:
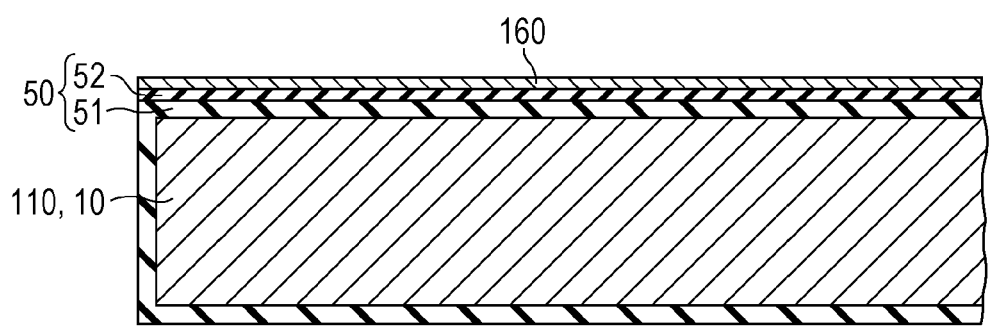
FIG. 8 is a cross-sectional view illustrating the method of manufacturing the recording head according to Embodiment 1.
Figure 9:
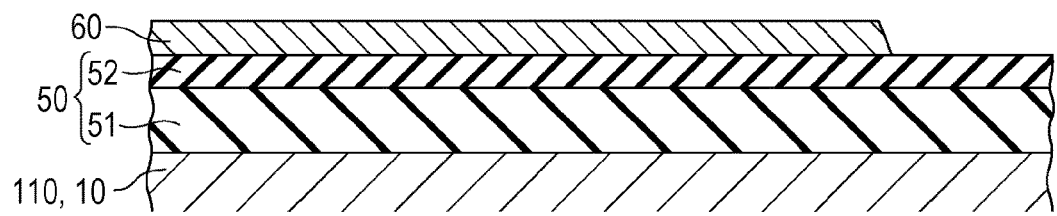
FIG. 9 is a cross-sectional view illustrating the method of manufacturing the recording head according to Embodiment 1.

Next, as illustrated in FIG. 8, a first electrode layer 160 for the first electrode 60 is formed over the entire insulation film 52 of the diaphragm 50. Then, as illustrated in FIG. 9, the first electrode 60 is formed by patterning the first electrode layer 160 into a predetermined pattern. Although a material for the first electrode 60 is not limited to particular materials, when the piezoelectric layer 70 is made of lead zirconate titanate (PZT), the first electrode 60 is preferably made of a material having electrical conductivity less likely to be affected by diffusion of lead oxide. For example, platinum or iridium can be preferably used as such a material for the first electrode 60, the first electrode layer 160 can be formed by sputtering or physical vapor deposition, and the first electrode 60 can be patterned by dry etching such as ion milling.

Next, according to the present embodiment, the piezoelectric layer 70 made of lead zirconate titanate (PZT) is formed. Specifically, according to the present embodiment, the piezoelectric layer 70 is formed by what is called a sol-gel method. In this method, a sol having a metal complex dissolved and distributed in a solvent is applied, dried to turn into a gel, and burned at a high temperature to form the piezoelectric layer 70 of metal oxide. A method of forming the piezoelectric layer 70 is not limited to a sol-gel method. Alternatively, for example, the piezoelectric layer 70 can be formed by metal-organic decomposition (MOD) or physical vapor deposition (PVD) such as sputtering or laser ablation. In summary, the piezoelectric layer 70 can be formed by either a liquid phase method or a gas phase method.

Figure 10:
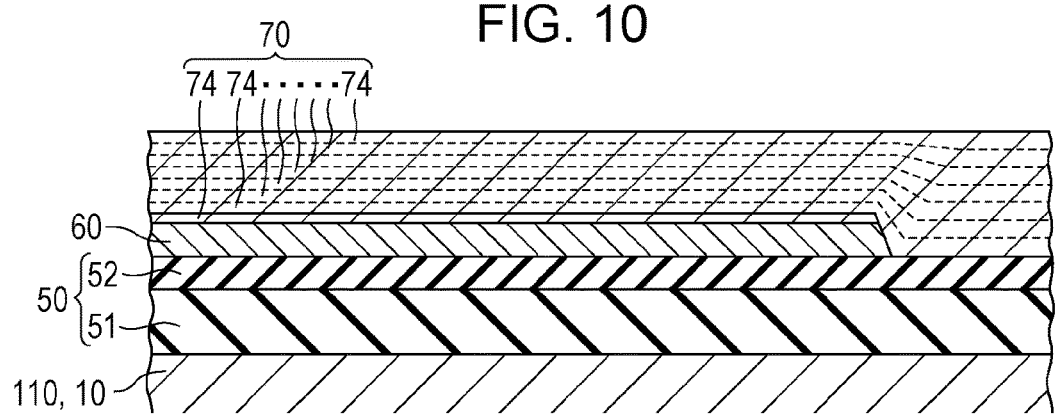
FIG. 10 is a cross-sectional view illustrating the method of manufacturing the recording head according to Embodiment 1.

Specifically, as illustrated in FIG. 10, the piezoelectric layer 70 having multiple piezoelectric films 74 is formed on the first electrode 60 and the diaphragm 50. The piezoelectric films 74 are formed by performing a piezoelectric film process multiple times. The piezoelectric film process includes an applying step, a drying step, a degreasing step, and a burning step. These steps are described below.

In the applying step, a piezoelectric precursor film is formed by applying a sol (solution) having a metal complex to the flow channel wafer 110 where the first electrode 60 is already formed. In the drying step, the piezoelectric precursor film is dried for a certain time by heating the piezoelectric precursor film to a predetermined temperature. In the degreasing step, the dried piezoelectric precursor film is degreased by heating the dried piezoelectric precursor film to a predetermined temperature for a certain period of time. Degreasing the piezoelectric precursor film means removing organic substances contained in the piezoelectric precursor film in the form of $NO_2$, $CO_2$, $H_2O$, or the like. In the burning step, the degreased piezoelectric precursor film is crystallized by heating the degreased piezoelectric precursor film to a predetermined temperature for a certain period of time. Thus, the piezoelectric film 74 is formed.

Examples of a heating apparatus used in the drying step, the degreasing step, and the burning step include a hot plate and a rapid thermal processing (RTP) device that produces heat by radiation from an infrared lamp.

Figure 11:
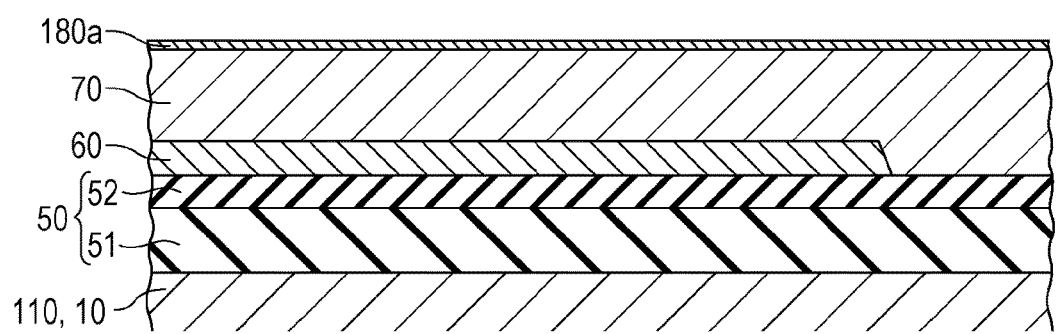
FIG. 11 is a cross-sectional view illustrating the method of manufacturing the recording head according to Embodiment 1.

Next, as illustrated in FIG. 11, a second electrode layer 180a made of a material for the second electrode 80 is formed on the piezoelectric layer 70. Although not shown in the drawings, according to the present embodiment, the second electrode layer 180a is formed by forming an iridium layer containing iridium on the piezoelectric layer 70 and by forming a titanium layer containing titanium on the iridium layer. For example, the iridium layer and the titanium layer can be formed by sputtering or chemical vapor deposition (CVD). Then, the piezoelectric layer 70 including the iridium layer and the titanium layer is heated again, i.e., subjected to post-annealing. Even if forming layers, such as the iridium layer, for the second electrode 80 on the piezoelectric layer 70 may cause damage to the piezoelectric layer 70, the post-annealing process repairs the damage and improves the piezoelectric properties of the piezoelectric layer 70.

Figure 12:
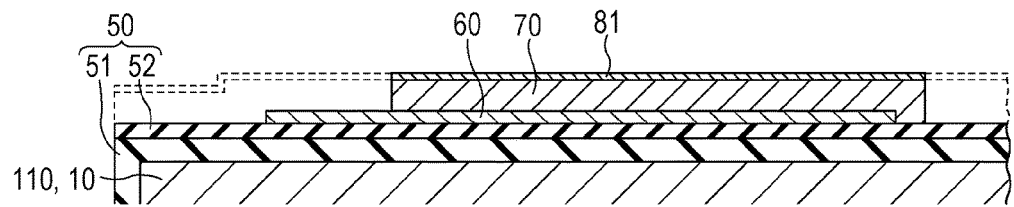
FIG. 12 is a cross-sectional view illustrating the method of manufacturing the recording head according to Embodiment 1.

Next, as illustrated in FIG. 12, the second electrode layer 180a and the piezoelectric layer 70 are patterned to correspond to each pressure generating chamber 12. This patterning forms a first layer 81 for the second electrode 80. According to the present embodiment, the second electrode layer 180a and the piezoelectric layer 70 are patterned by photolithography that places a patterned mask (not shown) on the second electrode layer 180a and etches these layers through the mask. For example, the piezoelectric layer 70 can be patterned by dry etching such as reactive ion etching or ion milling.

Figure 13:
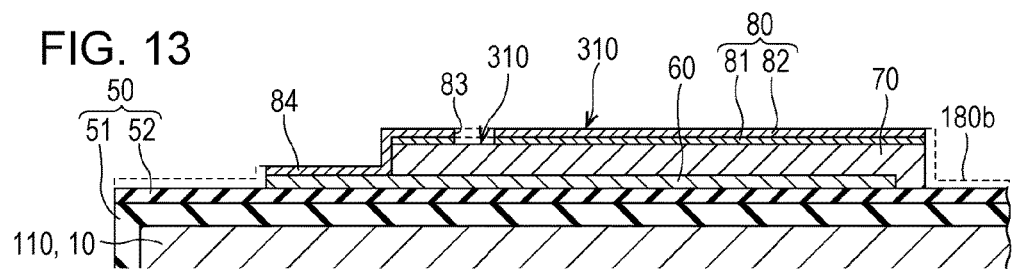
FIG. 13 is a cross-sectional view illustrating the method of manufacturing the recording head according to Embodiment 1.

Next, as illustrated in FIG. 13, a second electrode layer 180b made of, for example, iridium (Ir) is formed on one side of the flow channel wafer 110, where the piezoelectric layer 70 is formed, to cover the top of the first layer 81, the sides of the patterned piezoelectric layer 70, the top of the insulation film 52, and the top of the first electrode 60. Then, the second electrode layer 180b is patterned to form the second electrode 80 including the first layer 81 and a second layer 82.

During the patterning of the second layer 82, the first layer 81 is also partially patterned to form a cutout portion 83. The cutout portion 83 isolates the second electrode 80 including the first layer 81 and the second layer 82 from the conductive layer 84, which is electrically disconnected from the second electrode 80. The second electrode 80 formed in this way defines the active section 310. The conductive layer 84 has a portion that is located on the first electrode 60 and connected to the first lead electrode 91 as described later.

Figure 14:
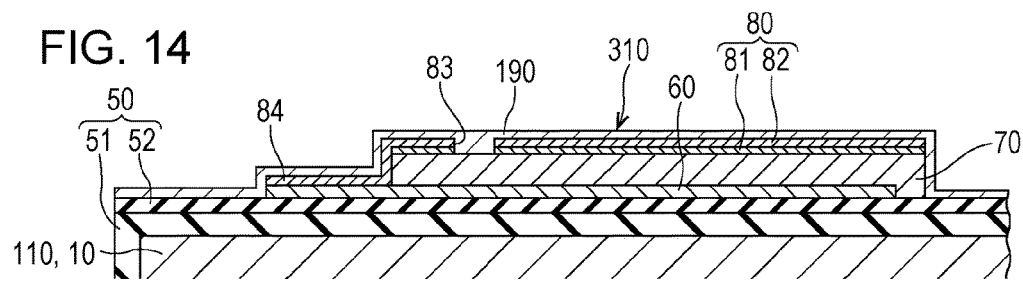
FIG. 14 is a cross-sectional view illustrating the method of manufacturing the recording head according to Embodiment 1.

Next, as illustrated in FIG. 14, a lead electrode layer 190 is formed on one side of the flow channel wafer 110 where the piezoelectric layer 70 is formed.

Specifically, the lead electrode layer 190 covers the top of the second electrode 80, the sides of the patterned piezoelectric layer 70, the top of the insulation film 52, and the top of the conductive layer 84. Further, the lead electrode layer 190 fills the cutout portion 83. The lead electrode layer 190 can be made of any conductive material. For example, according to the present embodiment, the lead electrode layer 190 is made of copper (Cu). Examples of methods of forming the lead electrode layer 190 include but not limited to sputtering and electroless plating.

Figure 15:
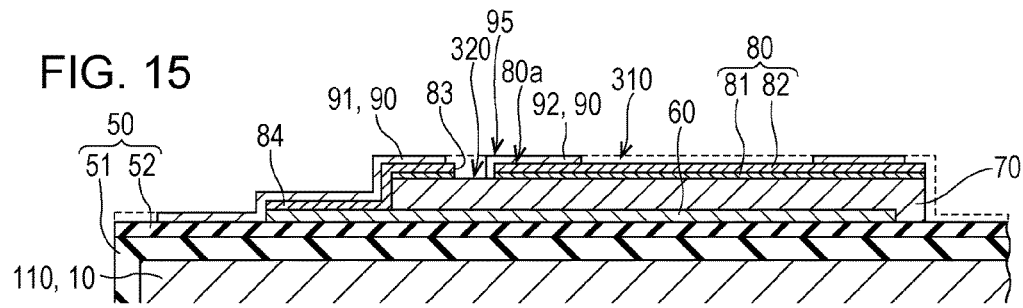
FIG. 15 is a cross-sectional view illustrating the method of manufacturing the recording head according to Embodiment 1.

Then, as illustrated in FIG. 15, the lead electrode layer 190 is patterned into a predetermined pattern. Specifically, the lead electrode layer 190 is patterned by forming a patterned mask (not shown) on the lead electrode layer 190 and by etching the lead electrode layer 190 through the mask.

The etching of the lead electrode layer 190 exposes a part of the inactive section 320 through the cutout portion 83. Thus, the first lead electrode 91 and the second lead electrode 92 are formed from the lead electrode layer 190. Then, a voltage application electrode 95 is formed above the piezoelectric layer 70 in the inactive section 320 where the second electrode 80 is not formed. According to the present embodiment, the voltage application electrode 95 is formed as part of the second lead electrode 92. Specifically, the etching of the lead electrode layer 190 forms the voltage application electrode 95 by leaving a part of the second lead electrode 92 in the inactive section 320 unetched. The part of the second lead electrode 92, i.e., the voltage application electrode 95 extends outwardly from an end 80a of the second electrode 80 to form a continuous electrode with the end 80a.

Further, according to the present embodiment, the etching of the lead electrode layer 190 forms the first lead electrodes 91 that are separately connected to the individual first electrodes 60. The lead electrode layer 190 can be etched by either wet etching or dry etching.

Figure 16:
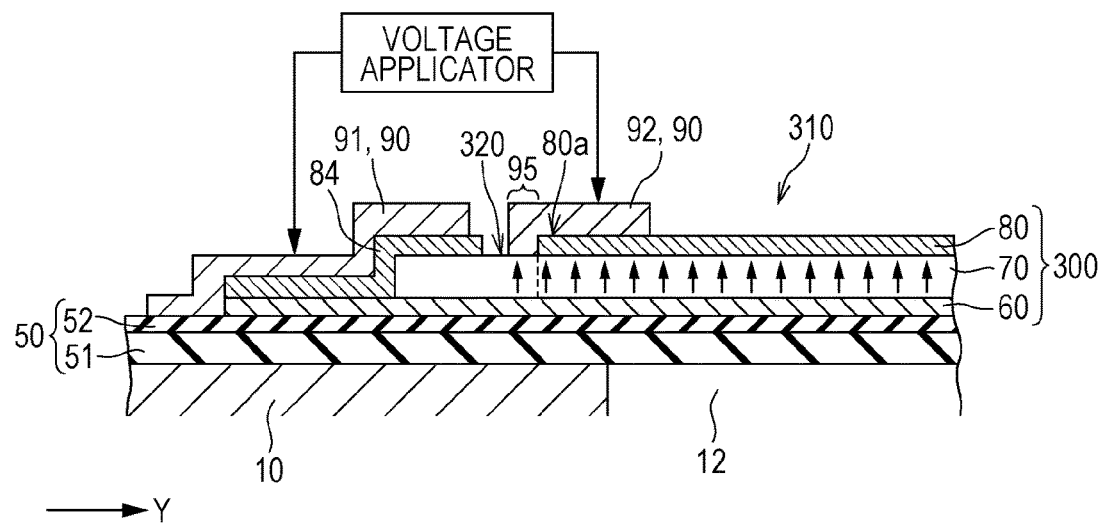
FIG. 16 is a cross-sectional view illustrating the method of manufacturing the recording head according to Embodiment 1.

Next, as illustrated in FIG. 16, a voltage is applied between the first electrode 60 and the second electrode 80. Specifically, the voltage is applied by connecting a voltage applicator between each first lead electrode 91 connected to a corresponding first electrode 60 and the second lead electrode 92 connected to the second electrode 80. Alternatively, the voltage can be applied by connecting the voltage applicator directly between each first electrode 60 and the second electrode 80. The voltage applicator generates a voltage for polarizing the piezoelectric layer 70 and can be a typical power source.

The application of a voltage between both electrodes of the piezoelectric element 300 aligns electric dipoles in the active section 310 so that the active section 310 can be equally polarized in one direction. Further, the voltage application electrode 95 in the inactive section 320 allows a corresponding part of the inactive section 320 to be equally polarized in one direction. Furthermore, since the voltage application electrode 95 extends from the second electrode 80, the equally-polarized part of the inactive section 320 extends from the boundary with the active section 310 accordingly.

Figure 17:
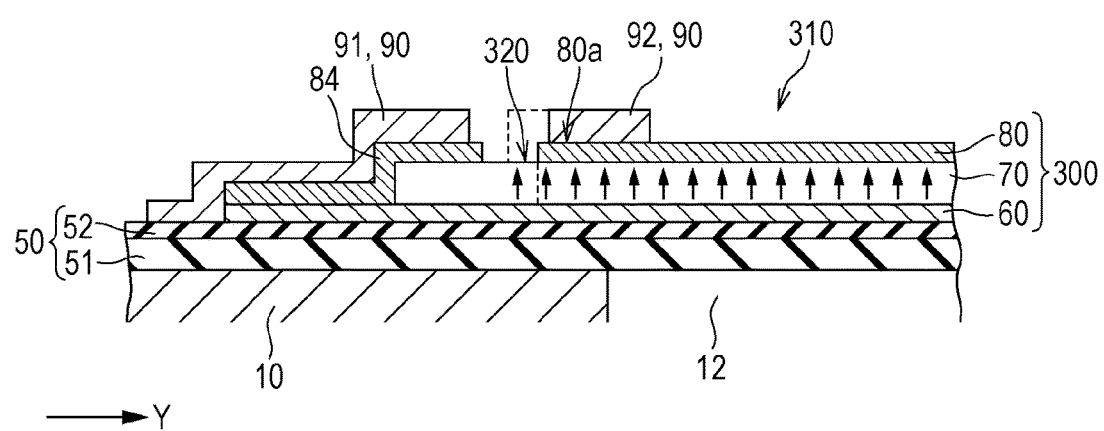
FIG. 17 is a cross-sectional view illustrating the method of manufacturing the recording head according to Embodiment 1.

Next, as illustrated in FIG. 17, the voltage application electrode 95 is removed by etching so that the inactive section 320 can be exposed.

As described above, the method of manufacturing the recording head 1 according to the present embodiment allows the part of the inactive section 320 from which the voltage application electrode 95 has been removed and which extends continuously from the boundary with the active section 310 to be polarized in the same direction as the active section 310.

Since the active section 310 and the inactive section 320 are polarized in the same direction, a manufactured piezoelectric element 300 has reduced stress concentration at the boundary between the active section 310 and the inactive section 320. Because of the reduced stress concentration, damage caused by burning and cracking is prevented or reduced at the boundary, defined by the end 80a of the second electrode 80, between the active section 310 and the inactive section 320 in the piezoelectric element 300. Thus, the recording head 1, as an example of a piezoelectric device, has reliable piezoelectric elements 300.

Applying corona discharge to the piezoelectric layer 70 may be used as an alternative method of polarizing the piezoelectric layer 70 in one direction. By forming the second electrode 80 and the second lead electrode 92 after polarizing the piezoelectric layer 70 in one direction by this alternative method, the piezoelectric element 300 of the recording head 1 may have similar effects to those obtained in the present embodiment. However, the alternative method requires a corona discharge apparatus and accordingly increases manufacturing cost. In contrast, the method according to the present embodiment does not require such an apparatus and accordingly can reduce an increase in manufacturing cost.

Further, when the second electrode 80 and the second lead electrode 92 are formed on the piezoelectric layer 70 after the piezoelectric layer 70 is polarized by the application of corona discharge, damage caused during the electrode formation may terminate the polarized condition of the piezoelectric layer 70. According to the present embodiment, the piezoelectric layer 70 is polarized after the second electrode 80 and the second lead electrode 92 are formed on the piezoelectric layer 70. This approach prevents the polarized condition of the piezoelectric layer 70 from being affected by damage caused during the electrode formation.

Further, the method of manufacturing the recording head 1 according to the present embodiment forms the voltage application electrode 95 from part of the second lead electrode 92. This approach removes the need to form the voltage application electrode 95 from a material different to that of the second lead electrode 92, thus reducing manufacturing cost and steps.

Figure 18:
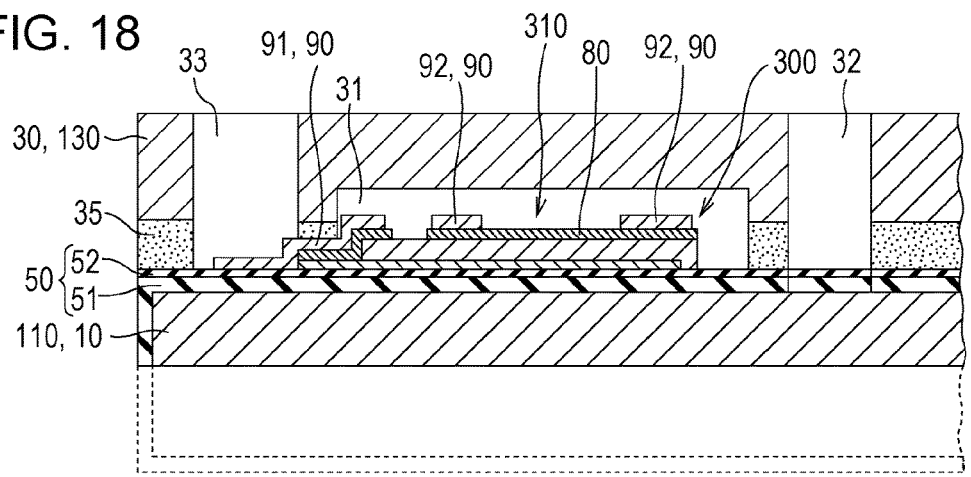
FIG. 18 is a cross-sectional view illustrating the method of manufacturing the recording head according to Embodiment 1.

Next, as illustrated in FIG. 18, a protection wafer 130 for providing protection substrates 30 is joined by the adhesive 35 to one side of the flow channel wafer 110 where the piezoelectric element 300 is formed. Then, the flow channel wafer 110 is thinned to a predetermined thickness.

Figure 19:
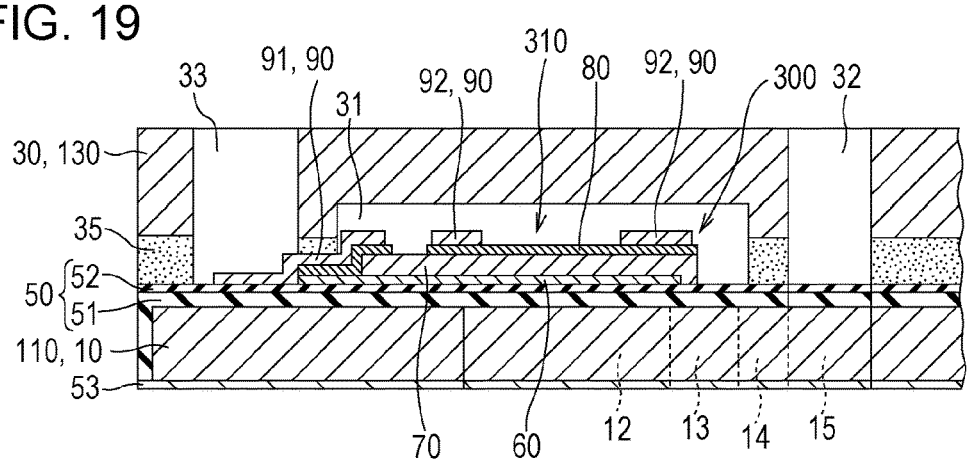
FIG. 19 is a cross-sectional view illustrating the method of manufacturing the recording head according to Embodiment 1.
Figure 20:
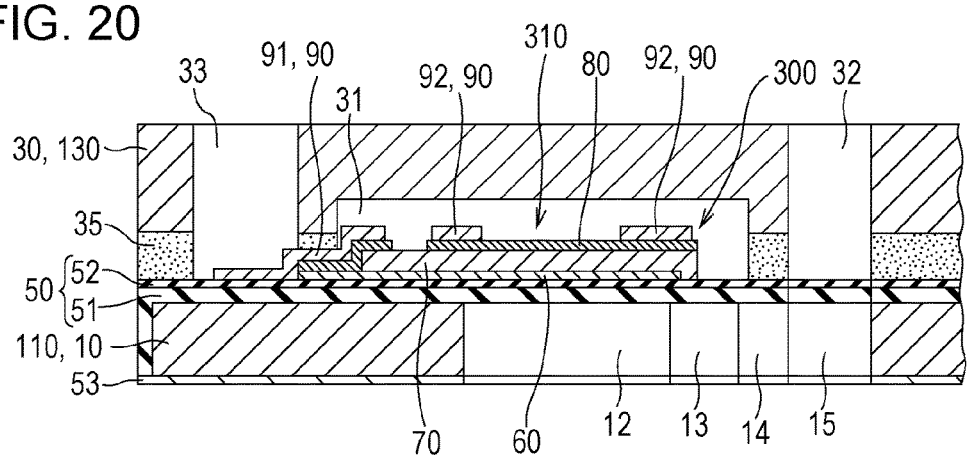
FIG. 20 is a cross-sectional view illustrating the method of manufacturing the recording head according to Embodiment 1.

Next, as illustrated in FIG. 19, a new mask 53 is formed on the flow channel wafer 110 and patterned into a predetermined pattern. Then, as illustrated in FIG. 20, the flow channel wafer 110 is anisotropically etched (wet etched) through the patterned mask 53 by using an alkaline solution such as a KOH solution so that the pressure generating chamber 12, the ink supply channel 13, the communication channel 14, the communication chamber 15, and the like corresponding to the piezoelectric element 300 can be formed.

Next, unnecessary outer edges of the flow channel wafer 110 and the protection wafer 130 are removed, for example, by cutting the unnecessary outer edges off in wafer dicing. Next, the nozzle plate 20 having the drilled nozzle openings 21 is joined to the other side of the flow channel wafer 110 on the opposite side to the protection wafer 130, and then the compliance substrate 40 is joined to the protection wafer 130. Finally, the flow channel wafer 110 is divided into individual flow channel substrates 10, each of which has a single chip size such as illustrated in FIG. 2. Thus, the recording head 1 according to the present embodiment is completed.

Embodiment 2

According to Embodiment 1, individual first lead electrodes 91 are formed by etching the lead electrode layer 190, and then a voltage is applied between each first lead electrode 91 and the second lead electrode 92. Alternatively, according to Embodiment 2, a voltage is applied before individual first lead electrodes 91 are formed.

FIGS. 21 and 22 are plan views of a flow channel substrate 10 according to Embodiment 2. Features similar to those described in Embodiment 1 are represented by the same reference characters as in Embodiment 1 and are not described.

FIG. 21 illustrates a condition observed after the diaphragm 50, the first electrode 60, the piezoelectric layer 70, the second electrode 80, and the lead electrode layer 190 are provided on the flow channel substrate 10, and the cutout portion 83 is formed.

In contrast to Embodiment 1, individual first lead electrodes 91 for different first electrodes 60 are not formed by patterning the lead electrode layer 190 while the cutout portion 83 is formed. According to the present embodiment, a wiring portion 91A connected in common to all the first electrodes 60 is formed while the cutout portion 83 is formed. Specifically, the cutout portion 83, the wiring portion 91A, and the second lead electrode 92 are each formed by patterning the lead electrode layer 190 (refer back to FIG. 14).

Then, a voltage is applied between the wiring portion 91A and the second lead electrode 92. Since the wiring portion 91A is connected to all the first electrodes 60, the voltage applied to the wiring portion 91A is also applied to all the first electrodes 60. Thus, like in Embodiment 1, the active section 310 and a part of the inactive section 320 covered with the voltage application electrode 95 are equally polarized in the same direction.

Next, as illustrated in FIG. 22, the voltage application electrode 95 is removed, and a part of the wiring portion 91A is removed. The removal of the part of the wiring portion 91A forms multiple first lead electrodes 91 that are separately connected to different first electrodes 60.

As described above, the method of manufacturing the recording head 1 according to the present embodiment can apply a voltage to all the first electrodes 60 simply by applying a voltage to the wiring portion 91A. Thus, like in Embodiment 1, a voltage can be applied to all of the first lead electrodes 91 (i.e., the first electrodes 60) at a single time through the wiring portion 91A, and the manufacturing process of the recording head 1 can be simplified accordingly.

Embodiment 3

According to Embodiments 1 and 2, the voltage application electrode 95 is formed from part of the second lead electrode 92. Alternatively, according to Embodiment 3, the voltage application electrode 95 is formed from part of the second electrode 80.

Figure 23:
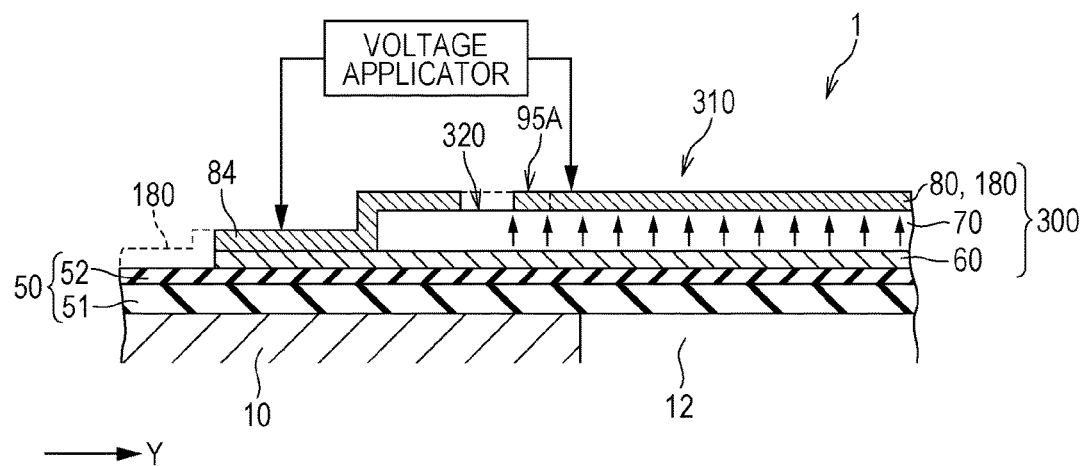
FIG. 23 is a cross-sectional view illustrating main components of a recording head according to Embodiment 3.
Figure 24:
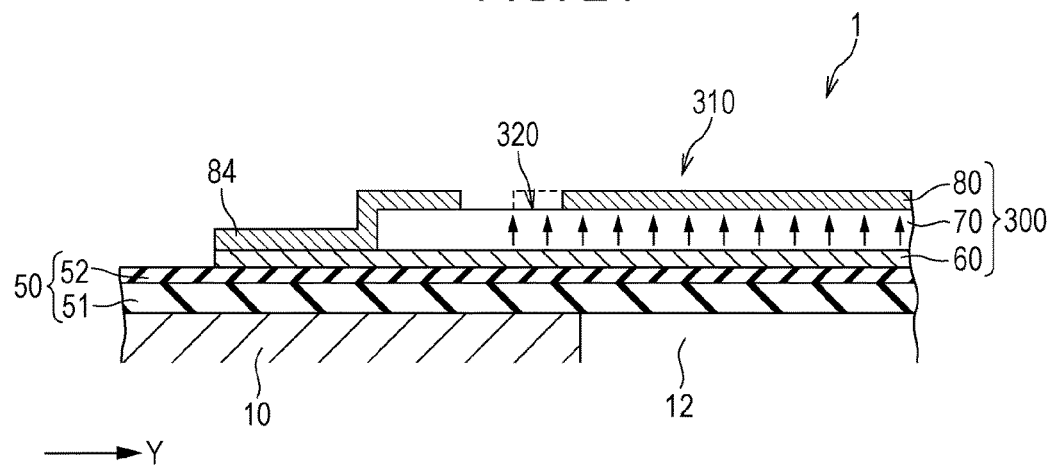
FIG. 24 is a cross-sectional view illustrating the main components of the recording head according to Embodiment 3.

FIGS. 23 and 24 are cross-sectional views illustrating main components of a recording head according to the present embodiment. Features similar to those described in Embodiment 1 are represented by the same reference characters as in Embodiment 1 and are not described.

As illustrated in FIG. 23, like in Embodiment 1, the diaphragm 50, the first electrode 60, and the piezoelectric layer 70 are provided on the flow channel substrate 10. After the piezoelectric layer 70 is formed, a second electrode layer 180 for the second electrode 80 is formed. Then, the second electrode 80 and a voltage application electrode 95A extending continuously from the second electrode 80 are formed by patterning the second electrode layer 180. Thus, the voltage application electrode 95A and the second electrode 80 are formed as a single piece.

Next, a voltage is applied between the second electrode 80 and the first electrode 60 or the conductive layer 84 that is part of the second electrode layer 180 remaining on the first electrode 60. This voltage application allows part of the piezoelectric layer 70 interposed between the first electrode 60 and each of the voltage application electrode 95A and the second electrode 80 to be equally polarized in the same direction. Alternatively, the voltage can be applied directly to the first electrode 60 instead of the conductive layer 84.

Next, as illustrated in FIG. 24, the voltage application electrode 95A is removed. Thus, part of the inactive section 320 from which the voltage application electrode 95A has been removed and which extends continuously from the boundary with the active section 310 is polarized in the same direction as the active section 310.

Then, like in Embodiment 1, the first lead electrode 91 is formed on the first electrode 60 (the conductive layer 84), and the second lead electrode 92 is formed on the second electrode 80. Thus, the piezoelectric element 300 is completed.

The method of manufacturing the recording head 1 according to the present embodiment has the same effects as those described in Embodiment 1. Further, the voltage application electrode 95A is formed as a single piece with the second electrode 80. This approach negates the need to form the voltage application electrode 95A from a material different to that of the second electrode 80, thus reducing manufacturing cost and steps.

Modifications

The above-described embodiments can be modified in various ways, for example, as described below.

Although the method of manufacturing the recording head 1 according to Embodiments 1 to 3 forms the first electrode 60 as individual electrodes separately provided for different piezoelectric elements 300 while forming the second electrode 80 as a common electrode shared with the piezoelectric elements 300, other configurations may be used.

In one modification, the first electrode 60 may be formed as a common electrode shared with the piezoelectric elements 300 while the second electrode 80 may be formed as individual electrodes separately provided for the piezoelectric elements 300. In this modification, multiple second lead electrodes are separately connected to individual second electrodes, and multiple voltage application electrodes, each of which extends outwardly from an end of a corresponding second lead electrode, are formed. Thus, Embodiment 1 can be applied to a case where the second electrode is formed as individual electrodes.

In another modification, a wiring portion connected to multiple second electrodes may be formed, and a voltage may be applied between the wiring portion and a first electrode as a common electrode, and then individual second electrodes may be formed by patterning the wiring portion. Thus, Embodiment 2 can be applied to a case where the second electrode is formed as individual electrodes.

In still another modification, a second electrode layer for the second electrodes 80 as individual electrodes may be formed, and individual second electrodes and voltage application electrodes separately extending from the second electrodes may be formed by patterning the second electrode layer. Thus, Embodiment 3 can be applied to a case where the second electrode 80 is formed as individual electrodes.

Although the wiring portion 91A and the second lead electrode 92 are formed by patterning the second electrode layer 180 in Embodiment 2, other configurations may be used. For example, like in Embodiment 1, after individual first lead electrodes 91 are formed, a wiring portion for connecting the first lead electrodes 91 together may be formed from a material different from that of the first lead electrodes 91. In this example, a voltage is applied between the wiring portion and the second lead electrode, and the wiring portion is then removed. This configuration also has the same effects as those described in Embodiment 1.

The ink jet recording heads described in the above embodiments are examples of liquid ejecting heads according to an aspect of the invention, and this aspect of the invention can be applied widely to common liquid ejecting heads that may eject liquid other than ink. Likewise, the ink jet recording apparatus described in the above embodiment is an example of liquid ejecting apparatus according to an aspect of the invention, and this aspect of the invention can be applied widely to a common liquid ejecting apparatus that may eject liquid other than ink. Examples of such liquid ejecting heads include recording heads used for an image recording apparatus such as a printer, colorant ejecting heads used for manufacturing color filters in displays such as liquid crystal displays, electrode material ejecting heads used for forming electrodes in displays such as organic EL displays and field emission displays (FEDs), and bioorganic substance ejecting heads used for manufacturing biochips.

In addition to piezoelectric devices for liquid ejecting heads including ink jet recording heads, some aspects of the invention can be applied to piezoelectric devices for other applications, including ultrasonic devices such as sonar devices, ultrasonic motors, pressure sensors, and pyroelectric sensors, to improve their reliability.

The entire disclosure of Japanese Patent Application No. 2016-018322, filed Feb. 2, 2016 is expressly incorporated by reference herein in its entirety.

What is claimed is:

1. A method of manufacturing a piezoelectric device including a piezoelectric element that is disposed above a substrate and has a multilayer structure including a first electrode disposed above the substrate, a piezoelectric layer disposed on the first electrode, and a second electrode disposed on the piezoelectric layer, the piezoelectric element associated with a pressure chamber, the method comprising:
    forming the multilayer structure including the first electrode, the piezoelectric layer, and the second electrode above the substrate, wherein the multilayer structure includes an active region and an inactive region, wherein no portion of the inactive region is disposed directly above the pressure chamber and wherein a first portion of the active region is directly above the pressure chamber and a second portion of the active region is not directly above the pressure chamber;
    forming a voltage application electrode extending outwardly from an end of the second electrode to cover a region, wherein the region is located above the piezoelectric layer and wherein no portion of the second electrode is positioned in the region, wherein the voltage application electrode electrically contacts the second electrode;
    applying a voltage between the first electrode and the second electrode, wherein the first electrode and the second electrode are arranged such that a first portion of the inactive region is polarized by the voltage in a thickness direction of the piezoelectric layer and a second portion of the inactive region is not polarized by the voltage; and
    removing the voltage application electrode.

2. The method according to claim 1, wherein
    the piezoelectric device further includes a second lead electrode connected to the second electrode, and
    part of the second lead electrode is formed as the voltage application electrode in the region.

3. The method according to claim 1, further comprising:
    forming a second electrode layer for the second electrode above the piezoelectric layer; and
    patterning the second electrode layer into the second electrode and the voltage application electrode extending from the second electrode.

4. The method according to claim 1, further comprising:
    forming a plurality of active sections interposed between the first electrode and the second electrode;
    forming one of the first electrode and the second electrode as a plurality of individual electrodes that are electrically independent of one another, each of the plurality of individual electrodes being provided for a corresponding one of the plurality of active sections,
    forming the other of the first electrode and the second electrode as a common electrode shared with the plurality of active sections;
    forming a wiring portion connected in common to the plurality of individual electrodes;
    applying a voltage between the common electrode and the wiring portion; and
    removing the wiring portion.

5. The method according to claim 1, the method further comprising:
    forming a plurality of active sections interposed between the first electrode and the second electrode;
    forming one of the first electrode and the second electrode as a plurality of individual electrodes that are electrically independent of one another, each of the plurality of individual electrodes being provided for a corresponding one of the plurality of active sections,
    forming the other of the first electrode and the second electrode as a common electrode shared with the plurality of active sections;
    forming a wiring portion connected in common to the plurality of individual electrodes;
    applying a voltage between the common electrode and the wiring portion, wherein
    the first electrode is formed as the plurality of individual electrodes that are electrically independent of one another, each of the plurality of electrodes being provided for a corresponding one of the plurality of active sections,
    the second electrode is formed as the common electrode shared with the plurality of active sections, and
    partially removing the wiring portion to form a plurality of first lead electrodes, each of the plurality of first lead electrodes being connected to a corresponding one of the plurality of individual electrodes.

* * * * *